(12) United States Patent
Magri' et al.

(10) Patent No.: US 9,070,694 B2
(45) Date of Patent: Jun. 30, 2015

(54) MANUFACTURING OF ELECTRONIC DEVICES IN A WAFER OF SEMICONDUCTOR MATERIAL HAVING TRENCHES WITH DIFFERENT DIRECTIONS

(71) Applicant: STMicroelectronics S.r.l., Agrate Brianza (IT)

(72) Inventors: Angelo Magri', Belpasso (IT); Francesco Lizio, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/108,598

(22) Filed: Dec. 17, 2013

(65) Prior Publication Data

US 2014/0175541 A1    Jun. 26, 2014

(30) Foreign Application Priority Data

Dec. 21, 2012  (IT) .............. MI2012A2226

(51) Int. Cl.

| | |
|---|---|
| H01L 21/82 | (2006.01) |
| H01L 23/00 | (2006.01) |
| H01L 29/423 | (2006.01) |
| H01L 27/02 | (2006.01) |
| H01L 29/06 | (2006.01) |
| H01L 21/28 | (2006.01) |
| H01L 29/78 | (2006.01) |
| H01L 29/66 | (2006.01) |

(52) U.S. Cl.
CPC .......... *H01L 23/562* (2013.01); *H01L 29/4238* (2013.01); *H01L 27/0207* (2013.01); *H01L 29/0696* (2013.01); *H01L 21/28008* (2013.01); *H01L 21/82* (2013.01); *H01L 29/7827* (2013.01); *H01L 29/4236* (2013.01); *H01L 29/66621* (2013.01)

(58) Field of Classification Search
CPC ............ H01L 29/4238; H01L 29/0696; H01L 29/7827; H01L 29/4236; H01L 23/562; H01L 21/82; H01L 21/28008
See application file for complete search history.

(56) References Cited

U.S. PATENT DOCUMENTS

| | | |
|---|---|---|
| 6,337,498 B1 | 1/2002 | Hasegawa et al. |
| 2009/0085147 A1 | 4/2009 | Ishiguro et al. |
| 2010/0090258 A1* | 4/2010 | Takaishi .................. 257/255 |

(Continued)

FOREIGN PATENT DOCUMENTS

| | | |
|---|---|---|
| EP | 1351313 A2 | 10/2003 |
| EP | 1959497 A2 | 8/2008 |
| JP | 2008004772 A | 1/2008 |

OTHER PUBLICATIONS

IT Search Report and Written Opinion for MI2012A002226 mailed Aug. 27, 2013 (7 pages).

*Primary Examiner* — Wael Fahmy
*Assistant Examiner* — Wasiul Haider
(74) *Attorney, Agent, or Firm* — Gardere Wynne Sewell LLP

(57) ABSTRACT

A method for integrating a set of electronic devices on a wafer (100; 200*a*; 200*b*) of semiconductor material having a main surface includes forming a plurality of trenches extending into the wafer from the main surface. At least one layer of electrically insulating material is formed within each trench. At least one layer of electrically conductive material is formed within each trench superimposed on the at least one layer of insulating material. The formation of the plurality of trenches includes forming the trenches partitioned into subsets of trenches. The trenches of a first sub-set are oriented along a first common direction that is different from the orientation of the trenches of a second sub-set.

15 Claims, 4 Drawing Sheets

(56) References Cited

U.S. PATENT DOCUMENTS

| | | |
|---|---|---|
| 2011/0233605 A1* | 9/2011 | Hsieh ............................ 257/139 |
| 2011/0266659 A1* | 11/2011 | Wilson et al. ................. 257/622 |
| 2012/0007178 A1 | 1/2012 | Oota |
| 2012/0007220 A1* | 1/2012 | Wu et al. ....................... 257/622 |
| 2012/0086051 A1* | 4/2012 | Wang et al. ................... 257/255 |
| 2012/0306020 A1* | 12/2012 | Shiraishi et al. .............. 257/368 |
| 2012/0322239 A1* | 12/2012 | Singh et al. ................... 438/462 |

* cited by examiner

MANUFACTURING OF ELECTRONIC DEVICES IN A WAFER OF SEMICONDUCTOR MATERIAL HAVING TRENCHES WITH DIFFERENT DIRECTIONS

PRIORITY CLAIM

This application claims priority from Italian Application for Patent No. MI2012A002226 filed Dec. 21, 2012, the disclosure of which is incorporated by reference.

TECHNICAL FIELD

The solution according to one or more embodiments of the present invention generally relates to the field of microelectronics. In greater detail, such a solution refers to the manufacturing of electronic devices in a wafer of semiconductor material.

BACKGROUND

Generally, electronic devices are manufactured in large volumes in a wafer of semiconductor material. The wafer is a very thin disc, having a substantially cylindrical shape with a radius of the bases of the cylinder, which define its (main) front and rear surfaces, far greater than a height thereof.

In order to manufacture the electronic devices, the wafer is subject to various chemical and physical processes known in the art.

In particular, the manufacturing of the electronic devices often involves the formation of trenches in the wafers, each of which comprises a groove (e.g., rectilinear one) that extends from the front surface of the wafer.

The trenches may be of insulating type for electrically insulating distinct electronic elements (e.g., resistors, transistors, etc.) comprised in a same electronic device one from another. In this case, the trenches are filled with one or more (electrically) insulating materials (e.g., a silicon oxide).

Moreover, the trenches may be of conducting type to form active regions of the electronic devices. For example, in the case of trench-type MOS transistors (Trench-MOS) the trenches are used to form gate regions of the MOS transistors. For this purpose, a layer of (electrically) insulating material (or more) is formed in the trenches, and a layer of (electrically) conductive material (or more) is formed over the layer of insulating material (in such a way to define the gate region insulated from the semiconductor material of the wafer). In the particular case of power devices (adapted to deliver relatively large amounts of energy, generically used to supply power to other electronic devices), the MOS transistor typically has a cellular structure with a plurality of elementary cells interconnected one to another. More specifically, a plurality of gate regions is formed in rectilinear trenches parallel one to another; a source region is formed between each pair of adjacent trenches, in such a way to be shared between two adjacent cells (whereas a common drain region is formed on the rear surface of the wafer). Subsequently, all the gate regions and all the source regions are electrically interconnected by means of common gate and source terminals, respectively, comprising corresponding metallization layers formed on the front surface.

The formation of (conductive) trenches in the wafer and the subsequent processes of filling them with insulating and conductive materials entail certain drawbacks. Indeed, during a manufacturing process of the electronic devices in the wafer, the trenches may warp up to deviate from the designed direction. This depends on a density and on an extent of the trenches with respect to the size of the wafer, and on the differences in chemical-physical properties of the materials of the layers formed in the trenches and their manufacturing conditions (used masks, process temperatures, etc.).

This event involves a substantial accentuation of a warping of the wafer, whose main surfaces deviate from corresponding ideal geometric planes. In other words, the wafer takes a warped shape, with the main surfaces that may exhibit curvatures along different directions. The warping of the wafer is irregular and asymmetrical, and it has the effect of reducing the efficiency of subsequent planarization operations of the wafer; for example, the warping of the wafer may create depressions sufficiently pronounced to be not completely leveled during the planarization operations. Furthermore, the wafer warping (at least the warping remaining after the planarization operations) makes the operations of forming upper layers on its front surface (e.g., metallization layers) more prone to imperfections and non-idealities. This might also form empty pockets at the interface between stacked upper layers able to undermine both electromagnetic and mechanical robustness of the electronic devices.

SUMMARY

In general terms, the solution according to one or more embodiments is based on the idea of forming the trenches with different directions.

More specifically, an aspect of the solution according to an embodiment provides a method for integrating a set of electronic devices on a wafer of semiconductor material, wherein trenches formed therein (in which at least one layer of an electrically insulating material and at least one layer of electrically conductive material superimposed thereto are formed) are partitioned into a plurality of sub-sets with the respective trenches oriented along a common direction different from the direction of the trenches of the other sub-sets.

Another aspect of the solution according to an embodiment provides a corresponding electronic device.

Another aspect of the solution according to an embodiment provides a system comprising one or more of such electronic devices.

BRIEF DESCRIPTION OF THE DRAWINGS

The solution according to one or more embodiments, as well as additional features and its advantages, will be better understood with reference to the following detailed description, given purely by way of a non-restrictive indication, to be read in conjunction with the attached figures (wherein corresponding elements are denoted with equal or similar references and their explanation is not repeated for the sake of brevity). In particular.

DETAILED DESCRIPTION OF THE DRAWINGS

With reference to FIGS. 1A-1F, some steps are schematically illustrated of a manufacturing process of electronic devices integrated on a wafer 100 of semiconductor material according to an embodiment.

In general, a same (or similar) structure is integrated simultaneously on a large number of identical areas of the wafer 100; at the end of the manufacturing process, these areas of the wafer 100 are separated into corresponding chips of semiconductor material by means of a cutting operation (for the sake of description simplicity, however, in the following reference will be made only to one of these chips).

Figure 1A:
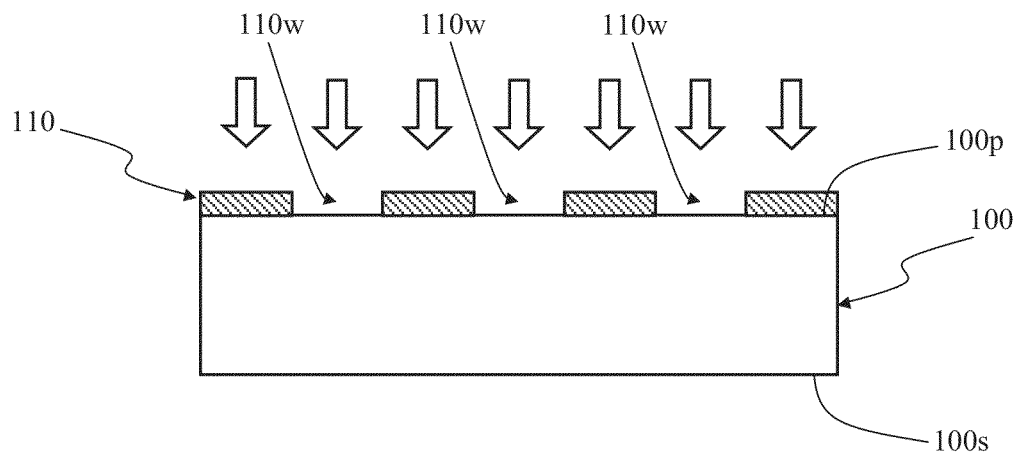
FIGS. 1A-1F schematically illustrate some steps of a manufacturing process of integrated electronic devices on a wafer in semiconductor material according to an embodiment, and FIGS. 2A-2D schematically illustrate implementation examples of the solution according to various embodiments.

Starting from FIG. 1A, the wafer 100 (e.g., N-type doped silicon), of which a cross section of a portion thereof is shown, is delimited by an upper main surface (hereinafter front surface) 100p and by a lower main surface (hereinafter rear surface) 100s opposed to each other, which may be protected by one or more layers of electrically insulating material—e.g., silicon oxide, tetraethyl orthosilicate or TEOS and/or silicon nitride (not shown in figures for the sake of simplicity).

A photolithographic mask 110 is deposited onto the front surface 100p. The photolithographic mask 110 is shaped in such a way to open a plurality of windows 110w (three of which are visible in FIG. 1A). The windows 110w expose portions of the front surface 100p in which corresponding trenches will be formed. Each window 110w generally has the shape of a stripe being elongated (with a length far greater than a width) and linear (with a substantially straight axis) on the front surface 100p.

The entire structure is subject to an anisotropic etching operation (represented by arrows in FIG. 1A)—e.g., by means of a plasma such as in the RIE, Reactive Ion Etching, technique; the anisotropic etching operation acts on the semiconductor material of the wafer 100 left exposed by the windows 110w in such a way to remove it selectively.

Figure 1B:
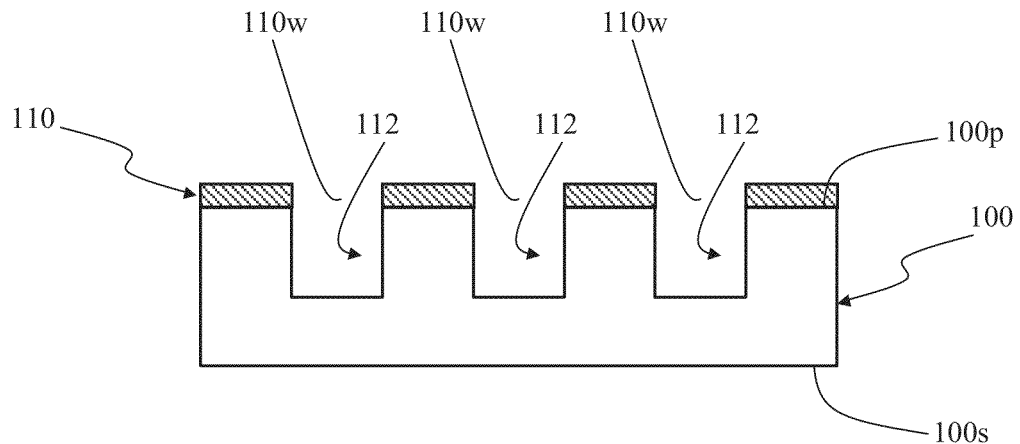

As shown in FIG. 1B, the anisotropic etching operation is controlled in such a way to form trenches 112 corresponding to the windows 110w, which trenches 112 extend into the wafer 100 from the front surface 100p to a depth determined by an intensity and by a duration of the anisotropic etching. Once the trenches 112 have been formed, the photolithographic mask 110 is stripped (e.g., chemically).

Figure 1C:
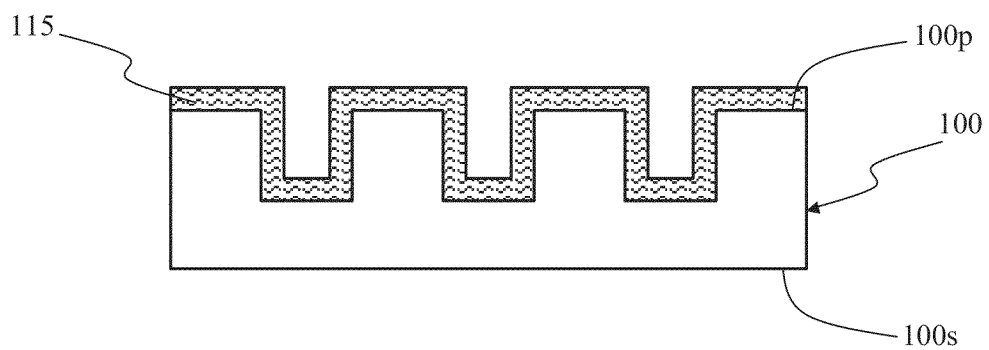

With reference now to FIG. 1C, a layer of electrically insulating material 115 (e.g., silicon oxide), or simply insulating layer 115, is deposited onto the entire wafer 100. For example, the wafer 100 may be subject to a Chemical Vapor Deposition or CVD operation, through which the insulating layer 115 is deposited onto the front surface 100p and onto the surfaces of the wafer 100 that delimit the trenches 112.

In alternative or in addition, the wafer 100 may be advantageously subject to a thermal oxidation (e.g., a dry thermal oxidation at temperatures between 800° C. and 1100° C.)—performed earlier than the CVD operation if performed in addition to the latter. During such thermal oxidation operation the exposed surfaces of the wafer 100 (in particular, the front surface 100p and the surfaces that delimit the trenches 112) react with molecular oxygen thereby forming the insulating layer 115—or a first portion thereof if performed in addition to the CVD operation. The insulating layer 115, if formed at least partially through the thermal oxidation operation, comprises a high-density oxide and it is thus capable of withstanding high voltages that may arise at ends thereof (ensuring a high robustness and reliability for the resulting electronic devices). In this case, the formation of the insulating layer 115, or of part thereof, through the thermal oxidation operation involves a consumption of semiconductor material of the wafer 100 (which is oxidized) in a way proportional to the thickness thereof. Therefore, in the design of the photolithographic mask used above it will be necessary to consider the amount of semiconductor material so consumed (accordingly reducing the size of its windows to obtain the desired size of the trenches 112).

Figure 1D:
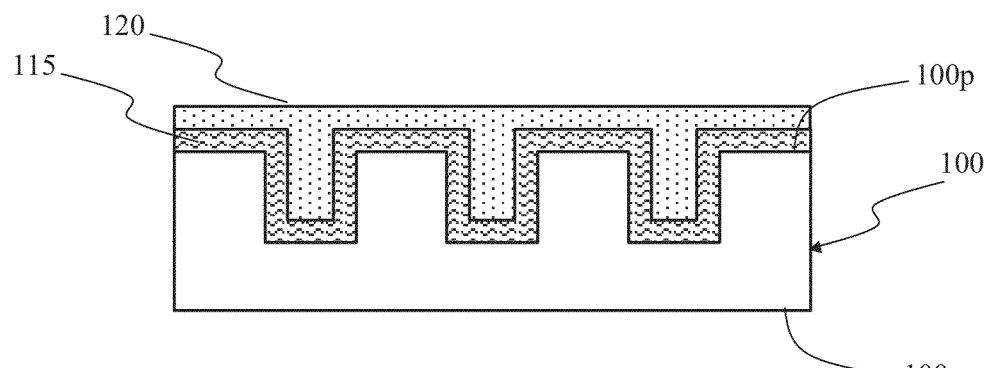

Turning to FIG. 1D, a layer of electrically conductive material 120 (e.g., polysilicon), or simply conductive layer 120, is deposited onto the insulating layer 115, in such a way to fill a free remaining space in each trench 112 and then to extend onto the entire wafer 100. Subsequently, an excess of the conductive layer 120 and of the insulating layer 115, which covers the front surface 100p, is removed by a Chemical Mechanical Planarization or CMP operation substantially up to expose the front surface 100p again.

Figure 1E:
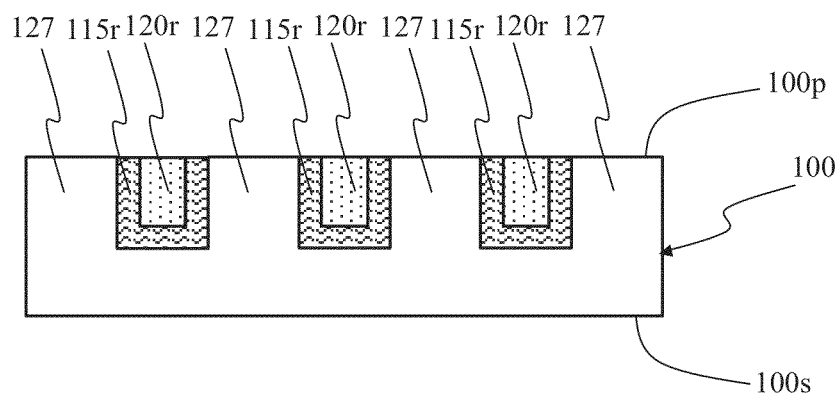

In this way, as shown in FIG. 1E, a distinct portion of the insulating layer (referred to as insulating layer 115r) and a distinct portion of the conductive layer (referred to as conductive layer 120r) remain in each trench 112; the conductive layer 120r is electrically insulated from the semiconductor material of the wafer 100 thanks to the insulating layer 115r.

Furthermore, each pair of adjacent trenches 112 defines a channel region 127 of the wafer 100 comprised therebetween (with an elongated and linear strip-like shape on the front surface 100p too).

Figure 1F:
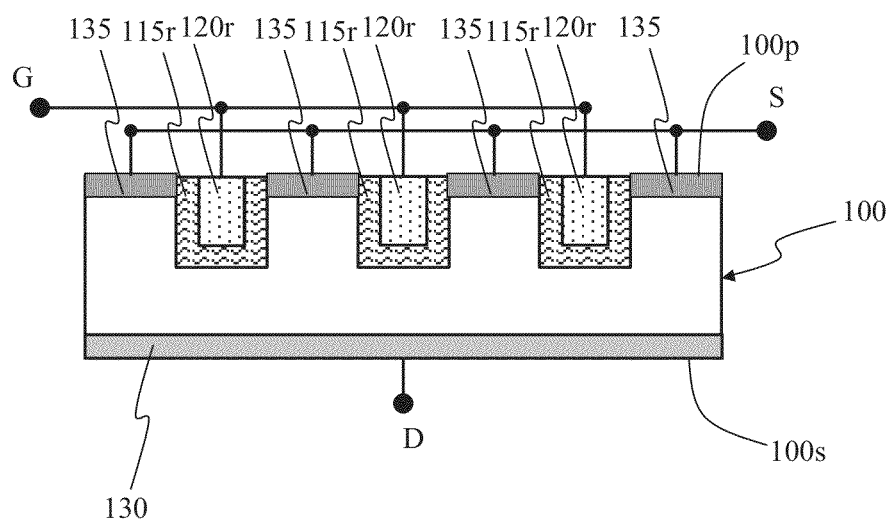

Turning now to FIG. 1F, a drain region 130, of P-type in the example at issue, is formed (e.g., by means of ion implantation) in such a way to extend into the wafer 100 from the rear surface 100s. Furthermore, a plurality of source regions 135, of the P-type in the example at issue, is formed (e.g., by means of ion implantation) in such a way that each of them extends into a corresponding channel region 127 from the front surface 100p. In this way, each source region 135 is separated from any other adjacent source region 135 by a corresponding trench 112 filled with the respective insulating layer 115r and conductive layer 120r, which defines a corresponding gate region (indicated with the reference 120r too).

Subsequently, in each chip the source regions 135 are electrically connected together and to a source electrical contact terminal S, the gate regions 120r are electrically connected together and to a gate electrical contact terminal G, whereas the drain region 130 is electrically connected to a drain electrical contact terminal D. The electrical contact terminals S, G, D—schematically represented by lines in FIG. 1F—are generally obtained by means of one or more deposition operations of corresponding metallization layers. In this way, in each chip a trench-MOS transistor with a cellular structure is defined.

In the solution according to an embodiment, as described in detail below, the trenches 112 are divided into two or more sub-sets. The trenches 112 of each one of such sub-sets are formed oriented along a common direction, which is different from the direction along which the trenches 112 of the other sub-sets are oriented (e.g., perpendicular to each other).

In this way, it is possible to reduce a warping of the wafer during the manufacturing process of the electronic devices. Indeed, the formation of the trenches along different directions distributes the contributions of the trenches to the warping of the wafer along different directions. This has the effect of reducing an overall warping of the wafer, since the contributions to the warping along different directions do not sum positively together (or at least they sum only partially).

In this way, the depressions of the wafer are more easily planarizable through planarization operations (e.g., the above-mentioned CMP operations). This reduces the imperfections and non-idealities of the operations of forming upper layers on the front surface of the wafer (e.g., the above-mentioned metallization layers); in particular, in this way it is possible to limit the formation of empty pockets at the interface between stacked upper layers, with a beneficial effect on both the mechanical and the electromagnetic robustness of the electronic devices.

In an embodiment, the trenches are divided into different sub-sets in such a way to ensure a sufficiently uniform distribution thereof.

For example, the trenches of each sub-set take an area on the main surface of the wafer at least equal to 10%, preferably at least equal to 15%, and still more preferably at least equal to 20% of a total area taken on the main surface of the wafer by all the trenches; for example, in the case of only two sub-sets, each of them takes an area equal to 20%-80%, preferably equal to 30%-70%, and still more preferably equal to 40%-60%, such as equal to 50% of this total area. Such ratios provide the best results in terms of reduction of the warping of the wafer.

Furthermore, trenches of different sub-sets are distributed alternated with respect to each other in a uniform manner on the front surface of the wafer.

For example, the trenches of each sub-set may be considered uniformly distributed if they take the same percentage (of the area taken by all the trenches) on the main surface in any portion thereof, having the same shape and an area at least equal to 5%-20% (such as equal to 10%) of the area of the entire main surface, with an error margin lower than or equal to 0.1%-5% (such as equal to 1%).

This allows obtaining a substantially controlled warping of the wafer. Indeed, a uniform distribution of the trenches of different sub-sets has the effect of dispersing their contributions to the warping of the wafer in a substantially random manner. Consequently, the pattern of the deformation of the wafer will follow a dome-type profile, substantially hemispherical, which is more easily treated by the planarization processes.

Examples of implementation of the solution according to various embodiments are schematically illustrated in FIGS. 2A-2D.

Figure 2A:
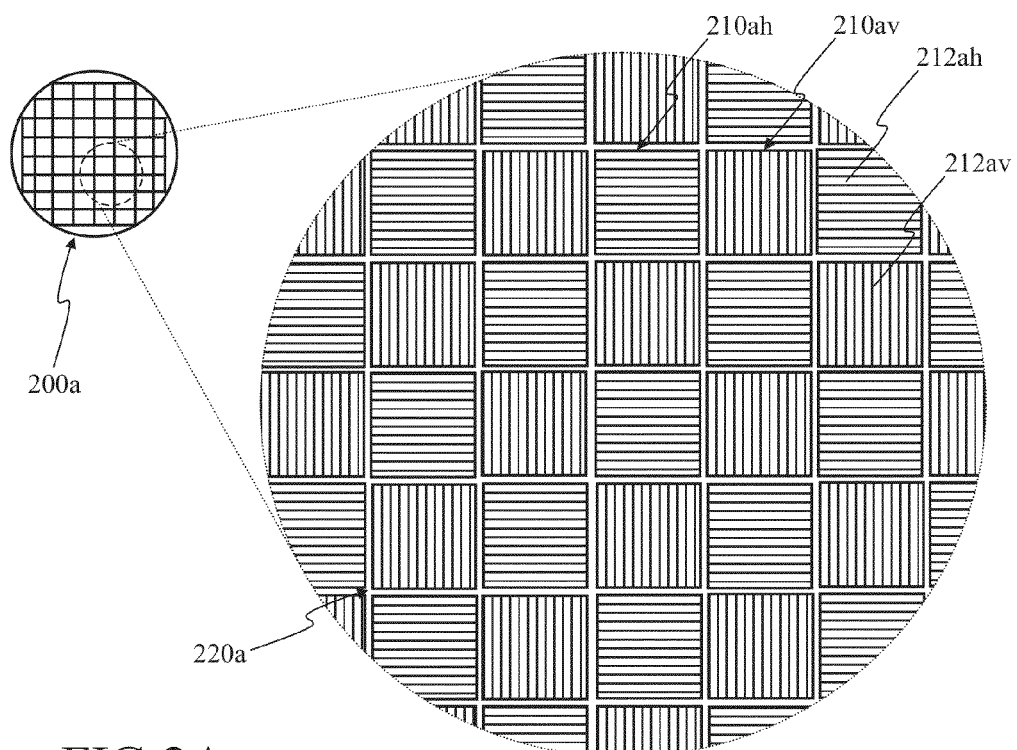

With particular reference to FIG. 2A, a plan view is schematically illustrated of the wafer (differentiated with the reference 200a) and of an enlarged portion thereof according to an embodiment.

The electronic devices integrated on the wafer 200a (which will then be separated into the corresponding chips) are indicated with the references 210ah, 210av (according to their different orientations, as described in detail below). The electronic devices 210ah, 210av have a generally rectangular shape in plan view—and more specifically a square one in the case shown in the figure.

The electronic devices 210ah, 210av are formed adjacent one to another, in a matrix arrangement (i.e., along rows and columns). Typically, the electronic devices 210ah, 210av are spaced apart by a (ballasting) sawing area 220a, which is provided to allow separating the chips comprising the electronic devices 210ah, 210av without damaging them during the cutting operation of the wafer 200a.

The electronic devices 210ah, 210av are all equal, but oriented in different ways in the wafer 200a. In particular, each electronic device 210ah and 210av comprises a predetermined number of trenches (differentiated with the references 212ah and 212av, respectively), which are oriented along a same direction. In the example in the figure, the trenches 212ah, 212av belong to two sub-sets of trenches. In detail, a first sub-set comprises the trenches 212ah oriented along a first direction (e.g., horizontal one in the figure), hereinafter referred to as horizontal trenches 212ah. Differently, a second sub-set comprises the trenches 212av oriented along a second direction (e.g., vertical one in the figure), hereinafter referred to as vertical trenches 212av.

The directions along which the trenches are oriented 212ah, 212av are selected corresponding to equivalent crystallographic directions of the wafer 200a, i.e., crystallographic directions that provide substantially equivalent electromagnetic characteristics. For example, in the case of silicon, crystallographic directions perpendicular to each other (as shown in the figure) are equivalent. In this way, the channel regions between each pair of adjacent trenches 212ah, 212av have homogeneous electromagnetic characteristics (e.g., an equivalent resistivity) in all the electronic devices 210ah, 210av (although oriented in a different way in the wafer 200a).

The electronic devices 210av with vertical trenches 212av are alternated to electronic devices 210ah with horizontal trenches 212ah both along the rows and along the columns of their matrix arrangement in the wafer 200a. In this way, a substantially uniform distribution of the horizontal trenches 212ah and of the vertical trenches 212av throughout the entire wafer 200a is achieved.

Such implementation does not involve any change in the structure of the electronic devices and it does not require any additional operation (but only a different arrangement thereof in the wafer).

Figure 2B:
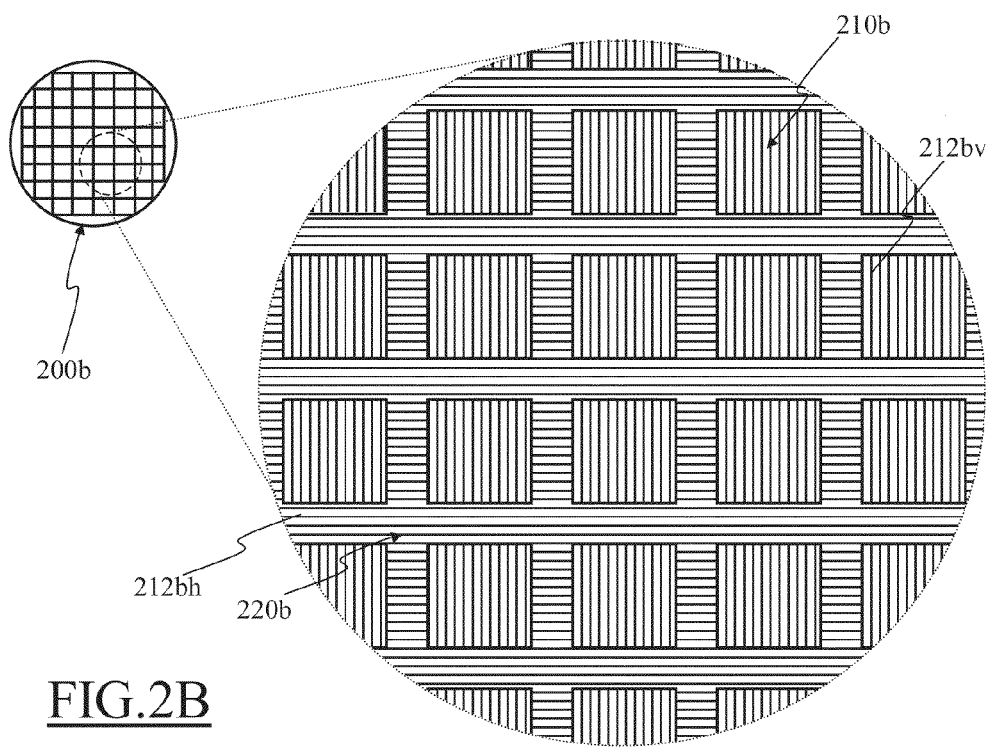

Turning now to FIG. 2B, it schematically illustrates a plan view of the wafer (differentiated with the reference 200b) and of an enlarged portion thereof according to another embodiment.

In this case, the electronic devices integrated on the wafer 200b (indicated with the reference 210b) are all equal, and also oriented in the same way in the wafer 200b. In particular, each electronic device 210b comprises a predetermined number of trenches (differentiated with the reference 212bv), which are oriented along a same direction (e.g., vertical one).

The sawing area (differentiated with the reference 220b) is formed with relatively large dimensions to further facilitate the subsequent separation of the chips comprising the electronic devices 210b formed in the wafer 200b; advantageously, such sawing area 220b is implemented in the case of electronic devices 212b of small size (e.g., 0.5-1 mm×0.5-1 mm). A predetermined number of trenches in the other direction, i.e., horizontal one in the example at issue (indicated with the reference 212bh), is formed in the sawing area 220b.

In this case as well a substantially uniform distribution is achieved of the horizontal trenches 212bh and of the vertical trenches 212bv on the entire wafer 200b.

Such implementation does not involve any change in the structure of the electronic devices and in their arrangement on the wafer (but only the additional operations for forming the trenches in the sawing area).

Figure 2C:
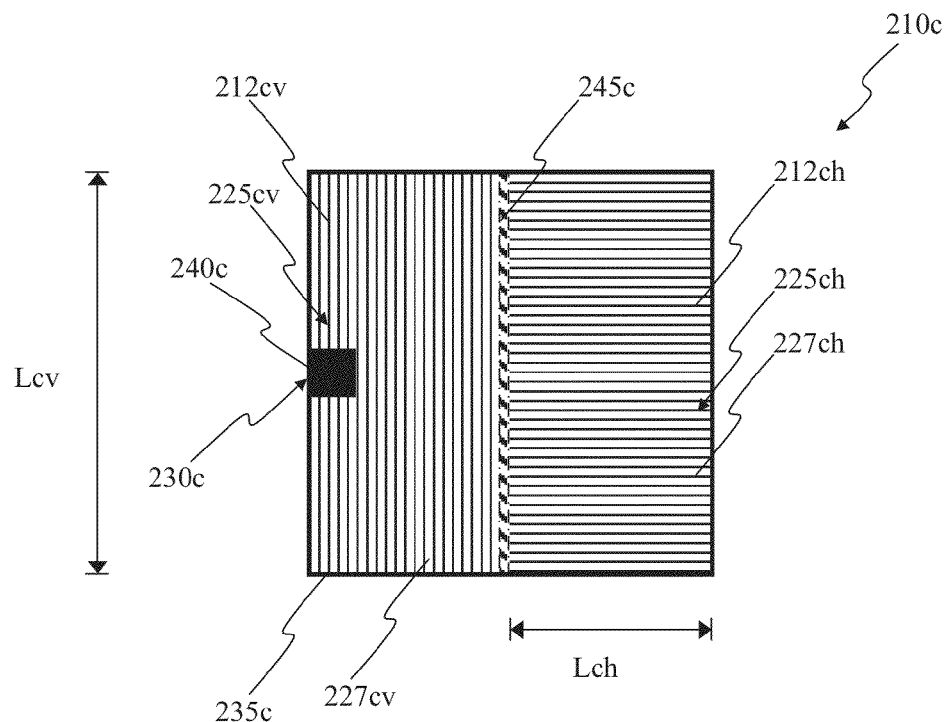

Considering now the FIG. 2C, it schematically illustrates a plan view of a single electronic device (differentiated with the reference 210c) according to another embodiment.

The electronic device 210c comprises at least one trench of each sub-set with different directions (i.e., horizontal one and vertical one in the example at issue). Particularly, an overall surface of the electronic device 210c is subdivided into two equal areas 225v and 225h. A predetermined number of vertical trenches (indicated with the reference 212cv) is formed in the area 225v, whereas a predetermined number of horizontal trenches (indicated with the reference 212ch) is formed in the area 225h.

In this way, it is achieved a substantially uniform distribution of the horizontal trenches 212ch and of the vertical trenches 212cv individually on the entire electronic device 210c (and therefore on the entire wafer in which the same electronic device is replicated).

Such implementation provides a greater uniformity (but with some changes to the structure of electronic devices).

Furthermore, the gate terminal (indicated with the reference 230c) is formed by a peripheral element 235c (i.e., a frame which runs along a perimeter of the chip) with a contact pad 240c (i.e., an enlarged region which extends from the frame towards the inside of the chip). The peripheral element 235c is electrically connected to end portions of the gate regions in the trenches 212ch, 212cv.

Therefore, the gate regions of the vertical trenches 212cv are connected through both their ends to the peripheral element 235c, whereas the gate regions of the horizontal trenches 212ch are connected through a single end (on the right in the figure) to the peripheral element 235c. In this way, during the operation of the electronic device 210c, the gate regions of the vertical trenches 212cv receive a gate signal applied to the gate terminal 230c at both their ends, whereas the gate regions of the horizontal trenches 212ch receive the same gate signal to the sole end connected to the peripheral element 235c. Therefore, in order to obtain a homogeneous distribution of the gate signal both in the gate regions of the vertical trenches 212cv and in the gate regions of the horizontal trenches 212ch, there is preferable to design the areas 225ch and 225cv so that a horizontal extent Lch of the horizontal trenches 212ch is substantially equal to a half of a vertical extent Lcv of the vertical trenches 212cv (Lch=Lcv/2). Thanks to this relation, in the gate regions of any trench 212ch, 212cv the gate signal is applied from each end connected to the peripheral element 235c by an extent substantially equal to Lcv/2=Lch.

Similar considerations apply to the distribution of the electric current flowing through the source terminal (not shown in the figure), which is formed by a contact element that extends in the area defined by the gate terminal 230c with longitudinal elements projecting therefrom that are connected to the whole vertical (indicated with the reference 227cv) and horizontal (indicated with the reference 227ch) conductive channels. In this case, the electrical characteristics (e.g., an equivalent resistivity) of the vertical conductive channels 227cv and of the horizontal conductive channels 227ch (connected through the entire extent thereof to the source terminal) are substantially equivalent.

Preferably, a termination element 245c interposed between the first area 225cv and the second area 225ch may be provided. The termination element 245c is formed substantially by a trench filled with insulating material (e.g., silicon oxide). Thanks to the termination element 245c, the horizontal trenches 212ch are kept separated from the vertical trenches 212cv; in this way, the formation is avoided of non-idealities in the contact regions thereof that might reduce a robustness of the electronic device (e.g., by reducing a breakdown voltage, or breakdown).

Figure 2D:
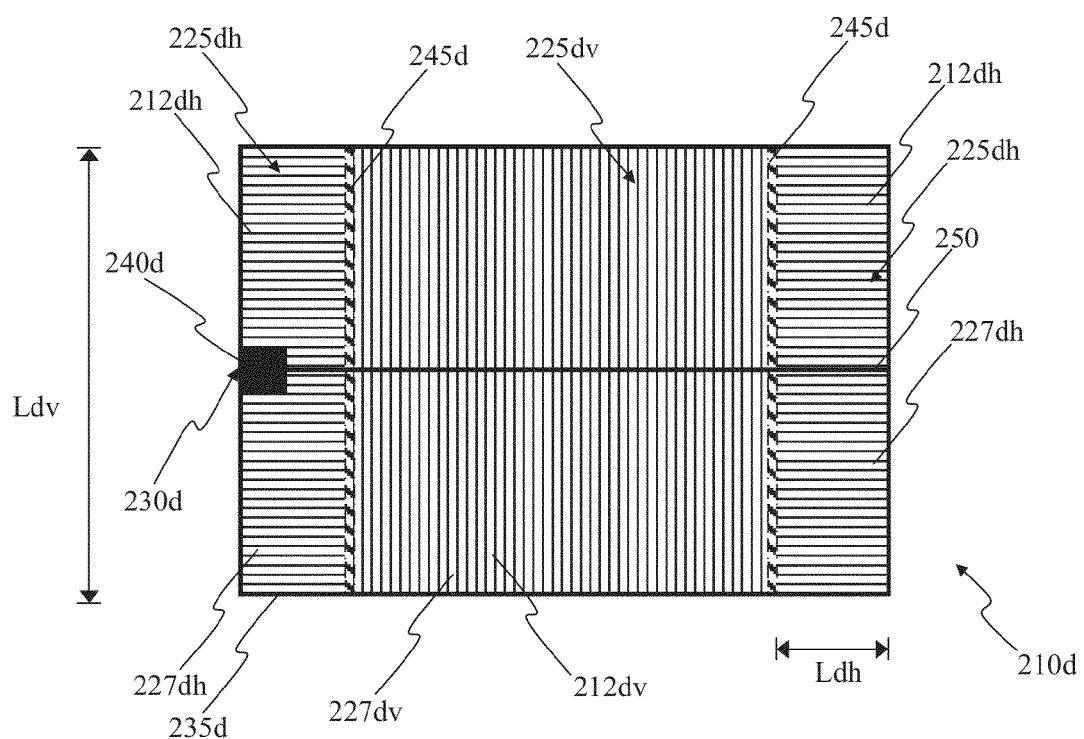

Turning to FIG. 2D, it schematically illustrates a plan view of a single electronic device (differentiated by the reference 210d) according to another embodiment.

In this case, the electronic device 210d has a rectangular shape and comprises two side areas 225dh in which a plurality of horizontal trenches 212dh is formed, separated by a central area 225dv in which a plurality of vertical trenches 212dv is formed. With this design of the areas 225dh, 225dv as well a substantially uniform distribution of the horizontal trenches 212dh and of the vertical trenches 212dv is achieved individually on the entire electronic device 210d (and therefore on the entire wafer in which the same electronic device is replicated), and a greater uniformity is provided (but with some changes to the structure of the electronic devices).

In this case, the gate terminal 230d of the electronic device 210d further comprises a finger element, or finger 250. The finger 250 is a strip that extends between the two (opposite) smaller sides of the peripheral element 235d, at the center thereof (in correspondence to the contact pad 240d). The finger 250 is electrically connected to the inner portions of the gate regions comprised in the vertical trenches 212dv, being transversal thereto.

In this way, during the operation of the electronic device 210d, the gate regions of the vertical trenches 212cv receive the gate signal applied to the gate terminal 230d at the center as well as at their ends; therefore, in the gate regions of the vertical trenches 212cv the gate signal is applied from the peripheral element 235d and from the finger 250 for an extent substantially equal to one-fourth of a vertical extent Ldv of the vertical trenches 212dv (with the effect of making it more homogeneous the transmission of the gate signal).

Consequently, in order to obtain in this case as well a homogeneous distribution of the gate signal in the gate regions of both the vertical trenches 212V and the horizontal trenches 212h it is preferable to design the areas 225hc in such a way that a horizontal extent Ldh of the horizontal trenches 212h is substantially equal to such value Ldv/4.

Such relation between vertical extent and horizontal extent may be implemented in electronic devices (not shown) comprising more than one single finger being evenly distributed (i.e., at each one-third, one-fourth, and so on of the vertical extent), by designing the horizontal extent equal to the vertical extent divided by the double of a value equal to the number of fingers incremented by one (i.e., Lh'=Lv'/[2(f+1)], where Lh' and Lv' are generic horizontal and vertical trench extents, respectively, and f is the number of the fingers).

In this case as well, similar considerations apply to the distribution of the electric current flowing through the source terminal (not shown in the figure), which is formed by a plurality of contact elements (two in the example of FIG. 2D) interconnected to each other; each of these contact elements extends on a respective one of the areas delimited by the gate terminal 230d and the finger 250, and comprises longitudinal elements projecting therefrom that are connected to the whole corresponding portions of the conductive vertical channels 227dv and of the conductive horizontal channels 227dh. Therefore, electrical characteristics (e.g., an equivalent resistivity) of the conductive vertical channels 227dv and of the conductive horizontal channels 227dh (connected through the entire extent thereof to the source terminal), are again substantially equal.

Preferably, although not limitatively, in the device 210d as well a termination element 245d may be provided interposed at the interface between the central area 225dv and each of the side areas 225dh.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms comprising, including, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment proposes a method for integrating a set of (one or more) electronic devices on a wafer of semiconductor material having a main surface. The method comprises the following steps. A plurality of trenches extending into the wafer from the main surface is formed. At least one layer of electrically insulating material is formed within each trench. At least one layer of electrically conductive material is formed within each trench superimposed to said at least one layer of insulating material. In the solution according to an embodiment, the step of forming a plurality of trenches comprises forming the trenches partitioned into a plurality of sub-sets; the trenches of each sub-set are oriented along a common direction different from the direction of the trenches of the other sub-sets.

However, each trench may comprise insulating and/or conductive layers in any number and of any type. The sub-sets may be in any number (two or more), each comprising any number (one or more) of trenches; moreover, the directions of the trenches of each sub-set may be of any type (e.g., slanted to one another).

In an embodiment, the step of forming a plurality of trenches further comprises forming the trenches in such a way that an area being taken on the main surface by the trenches of each sub-set is at least equal to 20% of an area being taken on the main surface by all the trenches.

However, nothing prevents distributing the trenches in a different way.

In an embodiment, the step of forming a plurality of trenches further comprises selecting the directions of the trenches corresponding to crystallographic directions of the wafer with equivalent electromagnetic properties.

However, nothing prevents selecting the directions of the trenches in a different way.

In an embodiment, the step of forming a plurality of trenches further comprises forming at least one trench of each sub-set in each electronic device.

However, nothing prevents forming trenches of some selected sub-sets only in each electronic device.

In an embodiment, each electronic device comprises a first area and a second area on the main surface. The step of forming a plurality of trenches further comprises forming a plurality of first trenches of a first one of the sub-sets in the first area of each electronic device and a plurality of second ones of the trenches of a second one of the sub-sets different from the first sub-set in the second area of each electronic device; the direction of the second trenches is perpendicular to the direction of the first trenches. The method further comprises the step of forming a contact terminal for each electronic device. The contact terminal comprises a peripheral element electrically connected to each end of said at least one layer of electrically conductive material of each first trench and to one end only of said at least one layer of electrically conductive material of each second trench; an extent of each second trench is equal to a half of an extent of each first trench.

However, the two areas may have different shapes and extents, each of which with any number of trenches. In any case, nothing prevents forming the contact terminal in any other way.

In an embodiment, each electronic device comprises a first area and two second areas being separated by the first area on the main surface. The step of forming a plurality of trenches further comprises forming a plurality of first ones of the trenches of a first one of the sub-sets in the first area of each electronic device and a plurality of second ones of the trenches of a second one of the sub-sets different from the first sub-set in each one of the second areas of each electronic device; the direction of the second trenches is perpendicular to the direction of the first trenches. The method further comprises the step of forming a contact terminal for each electronic device. The contact terminal comprises a peripheral element electrically connected to each end of said at least one layer of electrically conductive material of each first trench and to one end only of said at least one layer of electrically conductive material of each second trench, and at least one finger element extending with homogeneous distribution between two opposite sides of the peripheral element along the direction of the second trenches and connected to an intermediate point of said at least one layer of electrically conductive material of each of the first trenches; an extent of each second trench is equal to an extent of each first trench divided by the double of a value equal to the number of the finger elements incremented by one.

However, the various areas may have different shapes and extents, each of which with any number of trenches, and the finger elements may be in any number. In any case, nothing prevents forming the contact terminal in any other way.

In an embodiment, the electronic devices are partitioned into a plurality of further sub-sets each for a corresponding one of the sub-sets of the trenches. The step of forming a plurality of trenches further comprises forming at least one trench of the corresponding sub-set only in the electronic devices of each further sub-set.

However, in this case the electronic devices may be distributed in any other way in the wafer (and may also be not all equal one to another).

In an embodiment, the electronic devices are separated from each other by a sawing area of the wafer; the step of forming a plurality of trenches further comprises forming at least one trench of a first one of the sub-sets only in each electronic device, and forming at least one trench of a second one of the sub-sets different from the first sub-set in the sawing area.

However, nothing prevents forming trenches of more sub-sets in each electronic device and/or in the sawing area.

In an embodiment, the method further comprises the steps of forming at least one further trench at an intersection between each pair of trenches of different sub-sets, and forming at least one further layer of electrically insulating material within each further trench.

However, nothing prevents forming the further trenches in other positions (e.g., at a perimeter of each chip), and forming additional layers of electrically insulating material in any number and type. In any case, this feature may also be omitted in a simplified implementation.

In general, similar considerations apply if the same solution is implemented with an equivalent method (using similar steps with the same functions of more steps or of portions thereof, removing some steps being not essential, or adding further optional steps); moreover, the steps may be performed in different order, in parallel or overlapped (at least in part).

Another aspect of the solution according to an embodiment proposes an electronic device integrated on a chip of semiconductor material having a main surface. The electronic device comprises a plurality of trenches extending in the chip from the main surface, at least one layer of electrically insulating material within each trench, and at least one layer of electrically conductive material within each trench superimposed to said at least one layer of insulating material. In the solution according to an embodiment, the trenches are partitioned into a plurality of sub-sets; the trenches of each sub-set are oriented along a common direction different from the direction of the trenches of the other sub-sets.

However, the electronic device may be of any type (see below). In addition, the above solution may also be created in a hardware description language; moreover, if the designer does not manufacture the integrated device or its masks, the design may be transmitted through physical means to others. Anyway, the resulting integrated device may be distributed by its manufacturer in the form of a raw wafer, as a naked chip, or in packages.

In an embodiment, the integrated electronic device is a trench MOS power-transistor. The at least one layer of electrically conductive material defines a gate region of the MOS transistor. Moreover, the MOS transistor further comprises at least one source region extending from the main surface in each channel defined in the chip between each pair of adjacent trenches, and a drain region extending from a further main surface opposite the main surface in the chip.

However, the electronic device may be of any different type (such as a capacitor with fingered structure).

Another aspect of the solution according to an embodiment proposes a system (e.g., a mobile phone, a camera, and the like) comprising one or more of such electronic devices.

In general, similar considerations apply if the electronic device and/or the system each has a different structure or comprises equivalent components (e.g., of different materials), or it has other operating characteristics. In any case, any component may be separated into several elements, or two or more components may be combined into a single element. It should also be noted that (unless otherwise specified) any interaction between different components generally need not be continuous, and it may be direct or indirect through one or more intermediaries.

What is claimed is:

1. A method, comprising:
   forming a plurality of trenches extending into a wafer of semiconductor material from a main surface thereof, said wafer including a plurality of individual electronic devices;
   forming at least one layer of electrically insulating material within each trench; and
   forming at least one layer of electrically conductive material within each trench superimposed to said at least one layer of insulating material,
   wherein forming the plurality of trenches comprises:
      forming the trenches partitioned into a plurality of sub-sets, the trenches of a first sub-set being oriented along a first common direction and the trenches of a second sub-set being oriented along a second common direction different from the first common direction, the trenches of the first sub-set being formed in a first area on a main surface of the wafer in each individual electronic device, the trenches of the second sub-set being formed in a second area of the wafer in each individual electronic device; and
      forming a contact terminal for each individual electronic device, the contact terminal comprising a peripheral element encircling the individual electronic device and being electrically connected to each end of said at least one layer of electrically conductive material within the trenches of the first sub-set and to one end only of said at least one layer of electrically conductive material within the trenches of the second sub-set.

2. The method according to claim 1, wherein forming the plurality of trenches further comprises:
   forming the trenches of each sub-set in such a way that an area being taken on the main surface by the trenches of each sub-set is at least equal to 20% of an area being taken on the main surface by all the trenches.

3. The method according to claim 1, wherein forming the plurality of trenches further comprises:
   selecting the common directions of the sub-sets of trenches corresponding to crystallographic directions of the wafer with equivalent electromagnetic properties.

4. The method according to claim 1, wherein the second common direction is perpendicular to the first common direction.

5. The method according to claim 1, wherein a length of each second trench is equal to a half of a length of each first trench.

6. The method according to claim 1, wherein each individual electronic device comprises the first area, the second area and a third area, the second and third areas being separated by the first area on the main surface.

7. The method of claim 6, further comprising:
   forming at least one finger element extending with homogeneous distribution between two opposite sides of the peripheral element along the direction of the second trenches and connected to an intermediate point of said at least one layer of electrically conductive material of each one of the first trenches, a length of each second trench being equal to a length of each first trench divided by the double of a value equal to the number of the finger elements incremented by one.

8. The method according to claim 1, wherein each individual electronic device on the wafer is partitioned into a plurality of further sub-sets each for a corresponding one of the sub-sets of the trenches, and forming the plurality of trenches further comprises:
   forming at least one trench of the corresponding sub-set only in the electronic devices of each further sub-set.

9. The method according to claim 1, wherein each individual electronic device on the wafer is separated from other individual electronic devices by a sawing area of the wafer, and forming the plurality of trenches further comprises:
   forming at least one trench of the trenches of the first sub-set only in each individual electronic device, and
   forming at least one trench of the trenches of the second sub-set different from the trenches of the first sub-set in the sawing area.

10. The method according to claim 1, further comprising:
    forming at least one further termination trench at an intersection between the trenches of the first and second sub-sets, and
    forming at least one further layer of electrically insulating material within each further termination trench.

11. An electronic device integrated on a chip of semiconductor material having a main surface, comprising:
    a plurality of trenches extending in the chip from the main surface;
    at least one layer of electrically insulating material within each trench; and
    at least one layer of electrically conductive material within each trench superimposed to said at least one layer of insulating material;
    wherein the trenches are partitioned into a plurality of sub-sets, the trenches of one sub-set being oriented along a first common direction and the trenches of another sub-set being oriented along a second common direction different from the first common direction; and a contact terminal for each electronic device, the contact terminal comprising a peripheral element electrically connected to each end of said at least one layer of electrically conductive material in said trenches of said one sub-set and to one end only of said at least one layer of electrically conductive material in said trenches of said another sub-set.

12. The integrated electronic device according to claim 11, wherein the integrated electronic device is a trench MOS power transistor, said at least one layer of electrically conductive material defining a gate region of the MOS transistor, and wherein the MOS transistor further comprises at least one source region extending from the main surface in each channel defined in the chip between each pair of adjacent trenches, and a drain region extending from a further main surface opposite to the main surface in the chip.

13. A method, comprising:

dividing a wafer of semiconductor material into a plurality of regions;

in a first sub-set of the plurality of regions, forming a plurality of first trenches in each of the regions of the first sub-set having a first common orientation direction;

in a second sub-set of the plurality of regions, forming a plurality of second trenches in each of the regions of the second sub-set having a second common orientation direction different from the first common orientation direction;

wherein the wafer includes a plurality of integrated circuit devices, and wherein each individual integrated circuit device on the wafer includes at least one region of the first sub-set and at least one region of the second sub-set; and forming at least one additional trench for the integrated circuit device at an intersection between a region of the first sub-set and a region of the second subset, wherein the at least one additional trench is a termination trench.

14. The method of claim 13, wherein the second common orientation direction is perpendicular to the first common orientation direction.

15. An electronic device integrated on a chip of semiconductor material having a main surface, comprising:

a plurality of trenches extending in the chip from the main surface;

at least one layer of electrically insulating material within each trench; and at least one layer of electrically conductive material within each trench superimposed to said at least one layer of insulating material;

wherein the trenches are partitioned into a plurality of sub-sets, the trenches of one sub-set being oriented along a first common direction and the trenches of another sub-set being oriented along a second common direction different from the first common direction; and a contact terminal for each electronic device, the contact terminal comprising a peripheral element electrically connected to each end of said at least one layer of electrically conductive material of each first sub-set trench and to one end only of said at least one layer of electrically conductive material of each second sub-set trench.

* * * * *